US012580234B2

(12) United States Patent
Kim et al.

(10) Patent No.: US 12,580,234 B2
(45) Date of Patent: Mar. 17, 2026

(54) BATTERY APPARATUS AND MANUFACTURING METHOD THEREFOR

(71) Applicant: LG ENERGY SOLUTION, LTD., Seoul (KR)

(72) Inventors: Jae Hyung Kim, Daejeon (KR); Jin Hyun Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 613 days.

(21) Appl. No.: 17/925,796

(22) PCT Filed: Aug. 2, 2021

(86) PCT No.: PCT/KR2021/010081
§ 371 (c)(1),
(2) Date: Nov. 16, 2022

(87) PCT Pub. No.: WO2022/035108
PCT Pub. Date: Feb. 17, 2022

(65) Prior Publication Data
US 2023/0207895 A1 Jun. 29, 2023

(30) Foreign Application Priority Data
Aug. 11, 2020 (KR) ........................ 10-2020-0100658

(51) Int. Cl.
*H01M 10/42* (2006.01)
*H01M 50/284* (2021.01)
(Continued)

(52) U.S. Cl.
CPC ....... *H01M 10/425* (2013.01); *H01M 50/284* (2021.01); *H01M 50/298* (2021.01);
(Continued)

(58) Field of Classification Search
CPC ............. H01M 10/425; H01M 50/519; H01M 50/516; H01M 50/298; H01M 2010/4271; H05K 1/115
See application file for complete search history.

(56) References Cited

U.S. PATENT DOCUMENTS

2004/0251231 A1 12/2004 Takahira et al.
2009/0246615 A1 10/2009 Park
(Continued)

FOREIGN PATENT DOCUMENTS

CN 101066005 A 10/2007
CN 102386449 A 3/2012
(Continued)

OTHER PUBLICATIONS

International Search Report for PCT/KR2021/010081 mailed on Nov. 19, 2021.
(Continued)

*Primary Examiner* — Milton I Cano
(74) *Attorney, Agent, or Firm* — Birch, Stewart, Kolasch & Birch, LLP

(57) ABSTRACT

Provided are a battery apparatus including: a battery pack including a plurality of battery cells; a battery management system (BMS) for managing the plurality of battery cells; a board to which the BMS is mounted, the board including an insulation layer and a conductive layer; a plurality of wires extending from the plurality of battery cells onto the board; a plurality of through-holes formed in the board, the plurality of wires extending through the plurality of through-holes; a plurality of non-conductive areas, each of the plurality of non-conductive areas being formed on an area around a respective one of the plurality of through-holes; and a
(Continued)

plurality of soldering parts, each of the plurality of soldering parts being formed on the respective one of the plurality of through-holes.

14 Claims, 3 Drawing Sheets

(51) Int. Cl.

| | |
|---|---|
| *H01M 50/298* | (2021.01) |
| *H01M 50/516* | (2021.01) |
| *H01M 50/519* | (2021.01) |
| *H05K 1/11* | (2006.01) |
| *H05K 3/40* | (2006.01) |

(52) U.S. Cl.

CPC ....... *H01M 50/516* (2021.01); *H01M 50/519* (2021.01); *H05K 1/115* (2013.01); *H05K 3/4038* (2013.01); *H01M 2010/4271* (2013.01)

(56) References Cited

U.S. PATENT DOCUMENTS

| | | | | |
|---|---|---|---|---|
| 2013/0164568 | A1 | 6/2013 | Kim et al. | |
| 2014/0004392 | A1* | 1/2014 | Sung .................. | H01M 50/522 |
| | | | | 429/7 |
| 2018/0261823 | A1 | 9/2018 | Jan et al. | |

FOREIGN PATENT DOCUMENTS

| | | | |
|---|---|---|---|
| JP | 8-288647 | A | 11/1996 |
| JP | 11-242950 | A | 9/1999 |
| JP | 2004-273988 | A | 9/2004 |
| JP | 2009-64919 | A | 3/2009 |
| JP | 2009-163932 | A | 7/2009 |
| JP | 6022348 | B2 | 11/2016 |
| KR | 10-2007-0068847 | A | 7/2007 |
| KR | 10-0749655 | B1 | 8/2007 |
| KR | 10-0965683 | B1 | 6/2010 |
| KR | 10-2011-0096245 | A | 8/2011 |
| KR | 10-2012-0123491 | A | 11/2012 |
| KR | 10-2013-0025245 | A | 3/2013 |
| KR | 10-2013-0085571 | A | 7/2013 |
| KR | 10-1380075 | B1 | 4/2014 |
| KR | 10-1572650 | B1 | 12/2015 |
| KR | 10-2018-0118920 | A | 11/2018 |
| KR | 10-1944007 | B1 | 1/2019 |
| TW | 200301068 | A | 6/2003 |
| TW | I525878 | B | 3/2016 |

OTHER PUBLICATIONS

Extended European Search Report for European Application No. 21856114.0, dated Jul. 3, 2024.

\* cited by examiner

Fig. 8

BATTERY APPARATUS AND MANUFACTURING METHOD THEREFOR

CROSS REFERENCE TO RELATED APPLICATIONS

This application is the National Phase of PCT/KR2021/010081 filed on Aug. 2, 2021, which claims priority under 35 U.S.C. § 119 (a) to Patent Application No. 10-2020-0100658 filed in the Republic of Korea on Aug. 11, 2020, all of which are hereby expressly incorporated by reference into the present application.

BACKGROUND

A chargeable secondary battery, i.e., a battery, has been widely used as an energy source of a mobile device such as a smartphone. Furthermore, the battery has been used as an energy source of an electric vehicle and a hybrid electric vehicle, which are suggested as a measure for solving a limitation such as air pollution caused by a gasoline vehicle or a diesel vehicle, which uses a fossil fuel.

The kind of applications using the battery is extremely diversified due to an advantageous aspect of the battery, and the battery is expected to be applied to more fields and products than now.

The battery is classified into a lithium-ion battery, a lithium-ion-polymer battery, and a lithium-polymer battery according to a configuration of an electrode and an electrolyte, and the lithium-ion-polymer battery that has a low risk of leakage of the electrolyte and is easily manufactured has been increasingly used.

As described above, the battery has been widely used as an energy source of various products. However, since the battery contains all sorts of combustible materials, the battery has a risk of heating and explosion caused by overcharge, overcurrent, and other physical impacts. In order to prevent the above-described limitation, the battery includes a safety system such as a protection circuit for blocking a current in case of overcharge, overdischarge, and overcurrent, a positive temperature coefficient (PTC) element having a resistance that extremely increases when a temperature increases to block a current, and a safety vent for exhausting a gas or blocking a current when a pressure increases due to gas generation. A medium and large sized battery pack having a structure in which a plurality of battery modules are combined includes a safety system such as a fuse, a bimetal, or a battery management system (BMS) for protecting a battery cell against overdischarge, overcharge, and overcurrent.

Among the safety systems, the BMS is electrically connected with a plurality of battery cells configuring the battery pack. Here, one battery bank is configured as at least two battery cells are connected in parallel, and the battery pack includes at least two battery banks.

A wire extending from the battery cell to connect the BMS with the battery cells extends onto a board to which the BMS is mounted and is soldered onto the board to connect the battery cell with the BMS. As a through-hole is formed in the board, the wire is inserted into the through-hole, and as the wire above the through-hole is soldered, the BMS mounted on the board and the battery cell are connected through the wire. Here, the battery cells are necessarily connected to the BMS sequentially from a low battery cell to a high battery cell of the battery bank to blocking an electrical damage to at least one integrated circuit (IC) among a plurality of ICs configuring the BMS. For example, when first to eighth battery banks are provided from the top to the bottom, and first to n-th battery cells are arranged in each battery bank, the battery cells are connected to the BMS from the n-th battery cell to the first battery cell of the eighth battery bank, and, in the same manner, the battery cells from the eighth battery bank to the first battery bank are sequentially connected to the BMS.

However, when the battery banks are not sequentially soldered from the low battery bank, as a cell power is applied randomly to the BMS IC, an electrical damage may occur. That is, a power for operating the IC is received from the battery cell, and when a ground is not firstly connected, e.g., an intermediate battery cell among the first to n-th battery cells is firstly connected, a voltage of 4.2V or more is applied to an input pin of the IC, and two or more battery cells are connected although not allowed to cause an electrical damage as a voltage greater than an allowable voltage is applied to the IC. The electrical damage causes a malfunction of the IC as a current or a voltage greater than an allowable value is applied.

RELATED ART DOCUMENT

Patent Document (Patent document 1) Korean Patent Registration No. 10-1572650

(Patent document 2) Korean Patent Publication No. 2018-0118920

SUMMARY

The present disclosure provides a battery apparatus capable of preventing an electrical damage of a battery management system (BMS) when a wire extending from a battery cell is soldered onto a board to connect the battery cell and the BMS and a method of manufacturing the same.

The present disclosure also provides a battery apparatus preventing an electrical damage of a BMS even when the BMS is not connected sequentially from a battery cell of a low battery bank and a method of manufacturing the same.

In accordance with an exemplary embodiment, a battery apparatus includes: at least one battery pack including a plurality of battery cells; a battery management system (BMS) configured to manage the plurality of battery cells; a board to which the BMS is mounted, the board comprising an insulation layer and a conductive layer; a plurality of wires extending from the plurality of battery cells onto the board; a plurality of through-holes formed in the board, the plurality of wires extending through the plurality of through-holes; a plurality of non-conductive areas, each of the plurality of non-conductive areas being formed on an area around a respective one of the plurality of through-holes; and a plurality of soldering parts, each of the plurality of soldering parts being formed on the respective one of the plurality of through-holes.

The battery apparatus may further include a conductive pattern formed on the board, connected with the BMS, and connected with the plurality of wires by a respective one of the plurality of the soldering part.

Each of the plurality of non-conductive areas includes a non-conductive layer formed on an inside surface of the respective one of the plurality of through-holes.

Each non-conductive layer may be made of a material different from that of the insulation layer of the board.

Each non-conductive area may include a conductive pattern spaced by a predetermined distance from an outer circumference of the respective one of the plurality of through-hole.

The conductive pattern may be spaced by 0.3 mm to 1 mm from the outer circumference of the plurality of through-holes.

In accordance with another exemplary embodiment, a method of manufacturing a battery apparatus includes processes of: forming a through-hole in a board on which an insulation layer and a conductive layer are laminated; forming a conductive pattern on the board around the through-hole; forming a non-conductive layer on an inside surface of the through-hole; inserting a wire extending from a plurality of battery cells to an inside of the non-conductive layer of the through-hole; and forming a soldering part configured to connect the wire above the through-hole with the conductive pattern.

The method may further include mounting a battery management system (BMS) on the board before inserting the wire after the non-conductive layer is formed.

The conductive pattern may be formed on the board from an outer circumference of the through-hole.

The non-conductive layer may be made of a material different from that of the insulation layer of the board.

In accordance with still another exemplary embodiment, a method of manufacturing a battery apparatus includes processes of: forming a plurality of through-holes in a board; forming a conductive pattern on the board around the plurality of through-holes; inserting each of a plurality of wires into a respective one of the plurality of through-holes from a respective one of a plurality of battery cells; and forming a plurality of soldering parts for the plurality of through-holes, each of the plurality of soldering parts connects a respective one of the plurality of wires to the conductive pattern, and the conductive pattern is spaced by a predetermined distance from an outer circumference of the plurality of through-holes.

The conductive pattern may be formed on an area spaced by 0.3 mm to 1 mm from the outer circumference of the plurality of through-holes.

BRIEF DESCRIPTION OF THE DRAWINGS

Exemplary embodiments can be understood in more detail from the following description taken in conjunction with the accompanying drawings, in which:

FIGS. 4 to 6 are views for explaining a method of manufacturing a battery apparatus in accordance with an exemplary embodiment; and FIGS. 7 to 8 are views for explaining a method of manufacturing a battery apparatus in accordance with another exemplary embodiment.

DETAILED DESCRIPTION OF EMBODIMENTS

Figure 1:
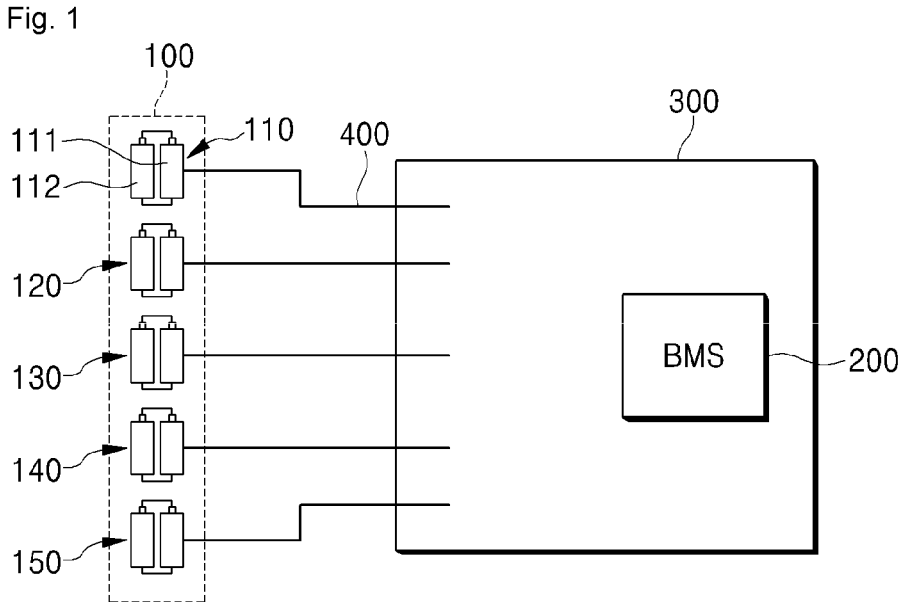
FIG. 1 is a block diagram for explaining a configuration of a battery apparatus in accordance with exemplary embodiments.

Hereinafter, specific embodiments will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. In the figures, the dimensions of layers and regions are exaggerated for clarity of illustration. Like reference numerals refer to like elements throughout.

Figure 2:
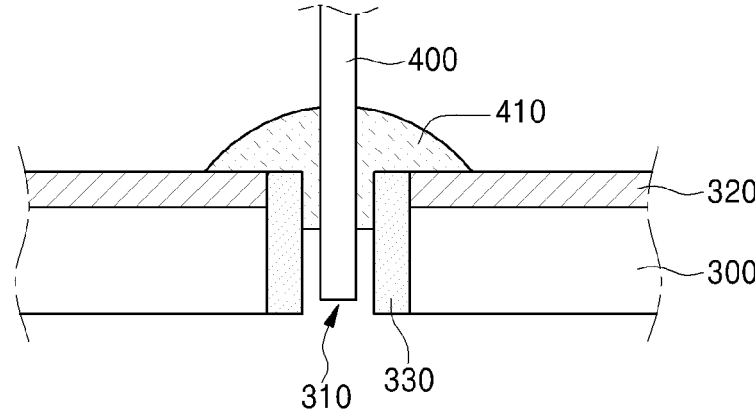
FIGS. 2 and 3 are partial cross-sectional views respectively illustrating battery apparatuses in accordance with an exemplary embodiment and another exemplary embodiment.
Figure 3:
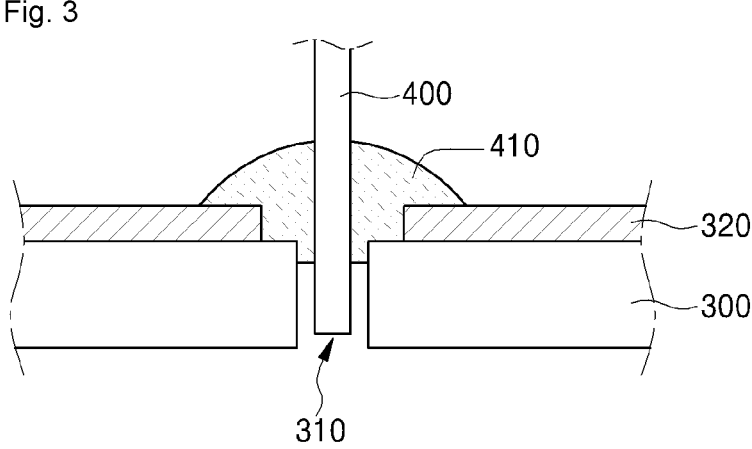

FIG. 1 is a block diagram for explaining a configuration of a battery apparatus in accordance with an exemplary embodiment. Also, FIGS. 2 and 3 are partial cross-sectional views respectively illustrating battery apparatuses in accordance with an exemplary embodiment and another exemplary embodiment. That is, FIGS. 2 and 3 are partial cross-sectional views respectively illustrating the battery apparatuses in which a wire inserted to a through-hole defined in a board is soldered in accordance with the exemplary embodiments.

Referring to FIG. 1, the battery apparatus in accordance with the exemplary embodiments may include: a battery pack 100 including a plurality of battery banks 110 to 150, a battery management system (BMS) 200 for managing the battery pack 100; a board 300 on which the BMS is mounted; a wire 400 extending from the battery pack 100 to connect a battery cell and the BMS 200 on the board 300; and a soldering part 410 for fixing the wire 400 on the board 300 for electrically connection therebetween. The configuration of the battery apparatus in accordance with an exemplary embodiment will be described in detail below.

The battery pack 100 supplies electric energy to applications such as a smartphone or an electric vehicle. The battery pack 100 may be managed by the BMS 200 and charged by an external power. Here, the battery pack 100 may include a plurality of battery banks 110 to 150. Also, each of the battery banks 110 to 150 may include a plurality of chargeable battery cells 111 and 112. Although each of the battery banks 110 to 150 includes two battery cells 111 and 112 in the drawing, each of the battery banks 110 to 150 may include two or more battery cells 111 and 112. Although reference numerals are applied to only the battery cells 111 and 112 of one battery, i.e., a first battery bank 110 in FIG. 1, since each of the rest battery banks 120 to 150 also includes the same number of battery cells having the same connection relationship, reference numerals are not applied to the battery cells of the battery banks 120 to 150. Hereinafter, the battery cells 111 and 112 refer to all battery cells of the battery banks 120 to 150. Also, the battery cells 111 and 112 of each of the battery banks 110 to 150 may be connected in parallel. For example, the battery cells 111 and 112 of the first battery bank 110 may be connected in parallel, and the battery cells 111 and 112 of each of second to fifth battery banks 120 to 150 may be also connected in parallel. However, the battery cells 111 and 112 may be serial-connected or serial-parallel-connected to each other in addition to the parallel connection. That is, the battery cells 111 and 112 may be serial-connected, parallel-connected, or serial-parallel-connected to each other. Here, the present invention is not limited to the kind of the battery cells 111 and 112. For example, the battery cells 111 and 112 may include a lithium-ion cell, a lithium-polymer cell, a nickel-cadmium cell, a nickel-hydride cell, and a nickel-zinc cell. The battery cells 111 and 112 is classified into a cylindrical cell in which an electrode assembly is contained in a cylindrical or angular metal can and a pouch cell in which an electrode assembly is contained in a pouch case made of an aluminium laminate sheet according to a shape of the case. Here, the cylindrical cell is described as an example in the exemplary embodiment.

The BMS 200 estimates a state of the battery pack 100 and manages the battery pack 100 by using estimated state information. For example, the state information of the battery pack 100 such as SOC, a state of health (SOH), a maximum input-output power allowance, and an output voltage is estimated and managed. Also, charge or discharge of the battery pack 100 is controlled by using the state information. The BMS in accordance with an exemplary embodiment includes a SOC estimation device for estimating a SOC of the battery pack 100. Also, the BMS 200 controls cell balancing for balancing a charge state of each battery cell. That is, the battery cell 111 and 112 in a relatively high charge state may be discharged, and the battery cell 111 and 112 in a relatively low charge state may be charged. Also, a sensing part for sensing a state of the battery pack 100 to manage the battery pack 100 by using the BMS 200 may be further provided. The sensing part may include a current sensor for sensing a current of the battery pack 100, a voltage sensor for sensing a voltage of the battery pack 100, and a temperature sensor for sensing a temperature of the battery pack 100. Here, at least one current sensor, at least one voltage sensor, and at least one temperature sensor may be provided. The BMS performing the above-described various functions may include various components and be mounted on the board 300. That is, a plurality of components for estimating the SOC, a plurality of components for cell balancing, a plurality of components for configuring the sensing part, and other passive elements may be mounted on the board 300. A charge-discharge protection circuit for protecting the battery pack 100 by controlling the charge-discharge of the battery pack 100 may be further provided. That is, the charge-discharge protection circuit may be mounted on the board 300 as a component separated from the BMS 200.

The board 300 may include a printed circuit board (PCB) in which a circuit pattern is formed on an insulation layer. The necessary circuit pattern of the PCB is formed by attaching a copper thin plate to a surface of a phenol-resin insulation layer or an epoxy-resin insulation layer and then etching the copper thin plate according to a predetermined pattern, and the above-described PCB may be used as the board 300. Here, a single sided board, a double sided board, and a multilayer board may be used as the PCB according to the circuit layer and the number of the insulation layers, and since the board having a large number of layers exhibits an excellent mounting capacity of electronic components and is used for a high-precision product, the number of layers may be selected according to the number and the degree of integration of components mounted to the PCB. In addition to a plurality of components configuring the BMS 200, a passive element such as a capacitor, an inductor, and a resistor may be mounted on the board 300. Also, a plurality of through-holes 310 may be defined in the board 300. Also, a predetermined conductive pattern 320 may be formed on a top surface of the board 300. Here, the conductive pattern 320 may be formed around the through-hole 310 on the board 300. The conductive pattern 320 may be connected to at least one component mounted on the board 300. That is, the conductive pattern 320 may be connected to at least a portion of the BMS 200.

The wire 400 may connect the battery cells 111 and 112 of the battery banks 110 to 150 with the BMS 200. That is, the wire 400 may extend from the battery cells 111 and 112 onto the board 300 and be connected with the BMS 200. Here, the wire 400 may be made of, e.g., copper, aluminum, or an alloy thereof. The wire 400 may extend from the battery cells 111 and 112 onto the board 300 and be inserted to the through-hole 310 of the board 300. Also, as a soldering part 410 is formed at an upper side of the through-hole 310 by soldering after the wire 400 is inserted to the through-hole 310, the wire 400 may be connected to the conductive pattern 320 on the board 300, and thus the battery pack 100 and the BMS 200 may be electrically connected to each other.

Here, as the inside of the through-hole 310 to which the wire 400 is inserted is not plated in an exemplary embodiment, the battery cells 111 and 112 and the BMS 200 may not be electrically connected to each other before the soldering part 410 is formed. That is, as illustrated in FIG. 2, in accordance with an exemplary embodiment, the soldering part 410 may be formed by soldering the wire 400 above the board 300 after a non-conductive layer 330 is formed on an inside surface of the through-hole 310, and the wire 400 is inserted inside the non-conductive layer 330. Since the non-conductive layer 330 is formed on the inside surface of the through-hole 310, the wire 400 may not contact a conductive material, e.g., the conductive pattern 320 on the board 300 in a process of inserting the wire 400 into the through-hole 310, and the battery cells and the BMS 200 may not be electrically connected to each other before the soldering part 410 is formed. Here, the non-conductive layer 330 may be made of a different kind of material from the board 300. That is, the non-conductive layer 330 may be made of a material different from the insulation layer of the board 300. Alternatively, the non-conductive layer 330 may be made of the same material as the insulation layer of the board 300. Here, the non-conductive layer 330 may be formed in a following process after the insulation layer and the conductive layer of the board 300 are formed. That is, the board 300 may be manufactured into the PCB on which the plurality of insulation layers and the conductive pattern are laminated and in which the through-hole 310 is formed, and then the non-conducive layer 330 in the through-hole 310 may be formed on the inside surface of the through-hole 310 in a following process.

Also, in another exemplary embodiment, as the conductive pattern 320 is not formed around at the upper side of the through-hole 310, the wire 400 may be inserted into the through-hole 310 and soldered, and then electrically connected. That is, as illustrated in FIG. 3, since the wire 400 and the conductive pattern 320 on the board 300 do not contact each other in the process of inserting the wire 400 into the through-hole 310 as the conductive patterns 320 on the board 300 is spaced a predetermined distance from the through-hole 310 in another exemplary embodiment, the battery cells and the BMS 200 may not be electrically connected to each other before the soldering part 410 is formed.

As described above, the exemplary embodiments allow the wire and the conductive pattern on the board not to be electrically connected with each other before the wire is inserted into the through-hole and soldered. That is, as the non-conductive layer is formed on the inside surface of the through-hole, the wire inserted to the through-hole may not be connected with the conductive pattern exposed to the inside of the through-hole or the conductive pattern on the board, and as the conductive pattern on the board is spaced a predetermined distance from the through-hole, the wire may not be connected with the conductive pattern on the board when inserted into the through-hole. Thus, the exemplary embodiment may prevent an electrical damage of the BMS when the wire extending from the battery cell is soldered on the board to connect the battery cell and the BMS. That is, even when the BMS is not connected sequentially from the battery cell of the low battery bank, an electrical damage may not be generated in the BMS.

A method of manufacturing the battery apparatus in accordance with exemplary embodiments will be described with reference to the drawings. Here, the exemplary embodiments describe the manufacturing method focused on the through-hole defined in the board.

Figures 4, 5, 6, 7:
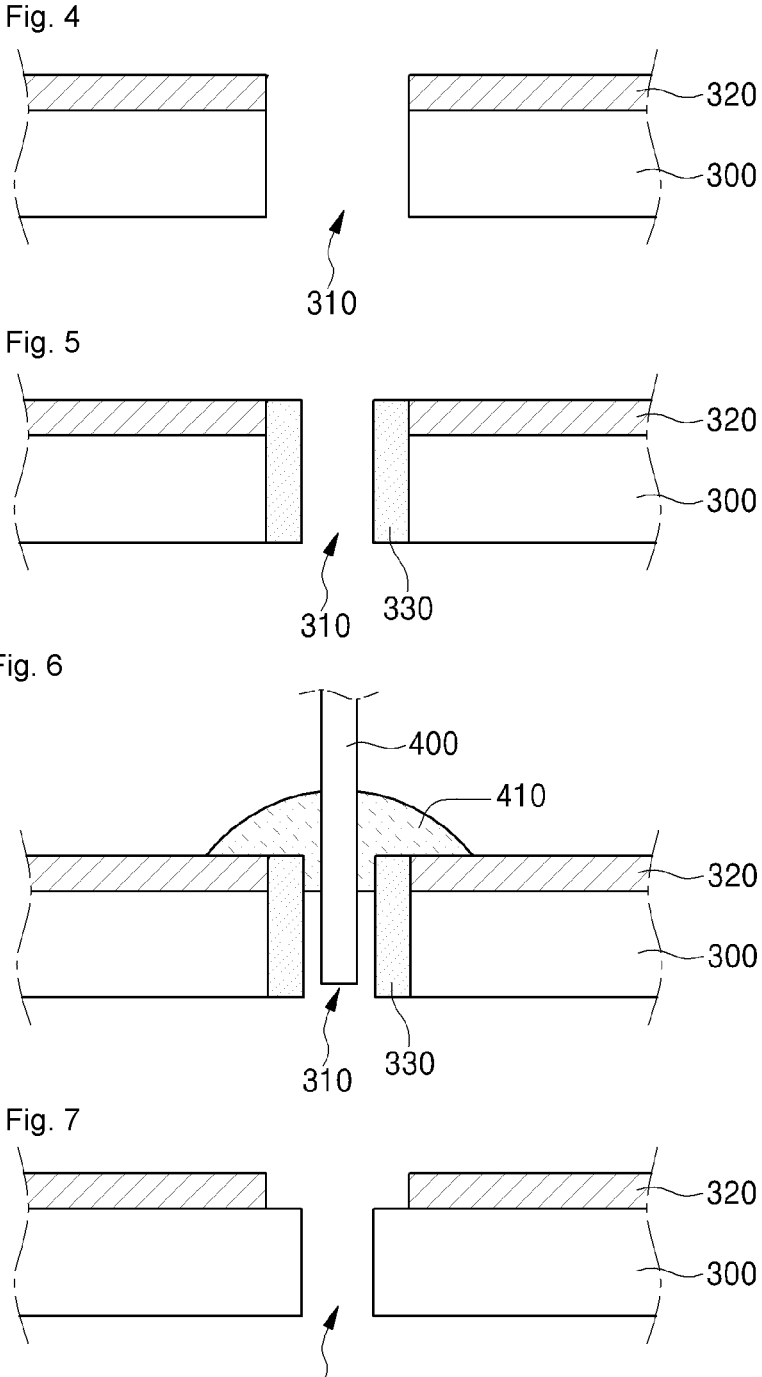

FIGS. 4 to 6 are views for explaining a method of manufacturing a battery apparatus in accordance with an exemplary embodiment.

Referring to FIG. 4, a through-hole 310 is formed in a predetermined area of the board 300.

The board 300 may be a PCB on which a predetermined conductive pattern is formed. That is, the board 300 may be a PCB on which at least one insulation layer is formed and a predetermined conductive pattern is formed on the insulation layer. For example, the board 300 may be formed such that a plurality of insulation layers are laminated thereon, and a predetermined conductive pattern is formed between the insulation layers. A plurality of through-holes 310 may be formed in the predetermined area of the board 300. The through-holes 310 may be formed in various methods. For example, the through-holes 310 may be formed by using a pressing machine at a plurality of positions to which a plurality of wires extending from the battery cells are inserted. Here, each of the through-holes 310 may be formed to have a diameter greater than that of the wire 400 extending from the battery cell, e.g., a diameter greater by two times to five times than that of the wire 400. Also, the conductive pattern 320 may be formed on the board 300. Here, the conductive pattern 320 may be formed as a predetermined pattern on an area except for the through-hole 310. That is, the conductive pattern 320 may be formed as a predetermined pattern from an extension line extending perpendicular to the inside surface of the through-hole 310. In other words, the conductive pattern 320 may be formed around the through-hole 310 from an area coinciding with the inside surface of the through-hole 310 in a vertical direction.

Referring to FIG. 5, a non-conductive layer 330 is formed on the inside surface of the through-hole 310.

The non-conductive layer 330 may be formed by applying an insulating material on the inside surface of the through-hole 310, and thus the through-hole 310 may have a diameter less than an initially formed diameter thereof. That is, the through-hole 310 may be formed to have a first diameter, and as the non-conductive layer 330 is formed on the inside surface of the through-hole 310, the through-hole 310 may have a second diameter less than the first diameter after the non-conductive layer 330 is formed. Here, the diameter of the through-hole 310 after the non-conductive layer 330 is formed may be also greater than that of the wire 400. For example, the through-hole 310 may have a diameter greater by 1.5 times to 3 times than that of the wire 400. Various processes may be used to form the non-conductive layer 330 on the inside surface of the through-hole 310. For example, the insulation layer may be remained on the inside surface of the through-hole 310 by applying an insulating material to cover the through-hole 310 and then removing the insulation layer on the board and penetrating the through-hole 310 again.

Referring to FIG. 6, a soldering part 410 is formed by inserting the wire 400 inside the through-hole 310 and then soldering an upper side of the wire 400. Thus, the wire 400 and the conductive pattern 320 may be electrically connected to each other by the soldering part 410.

That is, the method of manufacturing the battery apparatus in accordance with an exemplary embodiment may include: a process of preparing at least one battery pack 100 including a plurality of battery cells 111 and 112; a process of forming a plurality of wires 400 connected with the plurality of battery cells 111 and 112; a process of providing the board 300 on which at least one insulation layer and a conductive layer are formed and forming the through-hole 310 therein; a process of forming the conductive pattern 320 around the through-hole 310 on the board 300; a process of forming the non-conductive layer 330 on the inside surface of the through-hole 310; a process of inserting the wire 400 inside the non-conductive layer 330 of the through-hole 310; and a process of forming the soldering part 410 connecting the wire 400 and the conductive pattern 320 by soldering the wire 400 above the board 300. Here, the BMS 200 may be mounted onto the board 300 before the wire 400 is inserted after the non-conductive layer 330 is formed inside the through-hole 310.

Also, an exemplary embodiment described with reference to FIGS. 4 to 6 may be modified in various methods. For example, the through-hole 310 may be formed before the conductive pattern 320 is formed, the non-conductive pattern 330 may be formed on the inside surface of the through-hole 310, and then the conductive pattern 320 may be formed around the through-hole 310 on the board 300. That is, a modified example of the method of manufacturing the battery apparatus in accordance with an exemplary embodiment may include: a process of forming the through-hole 310 in the board 300; a process of forming the non-conductive layer 330 on the inside surface of the through-hole 310; a process of forming the conductive pattern on the board 300 around the through-hole 310; a process of inserting the wire 400 inside the non-conductive layer 330 of the through-hole 310; and a process of forming the soldering part 410 connecting the wire 400 and the conductive pattern 320 by soldering the wire 400 above the board 300.

As described above, in accordance with an exemplary embodiment, the soldering part 410 may be formed by soldering the wire 400 above the board 300 after the non-conductive layer 330 is formed on the inside surface of the through-hole 310, and the wire 400 is inserted inside the non-conductive layer 330. Since the non-conductive layer 330 is formed on the inside surface of the through-hole 310, the wire 400 may not contact the conductive pattern 320 on the board 300 in a process of inserting the wire 400 into the through-hole 310, and the battery cells and the BMS 200 may not be electrically connected to each other before the soldering part 410 is formed. That is, as the inside of the through-hole 310 to which the wire 400 is inserted is not plated in an exemplary embodiment, the battery cells and the BMS 200 may not be electrically connected to each other before the soldering part 410 is formed.

Figure 8:
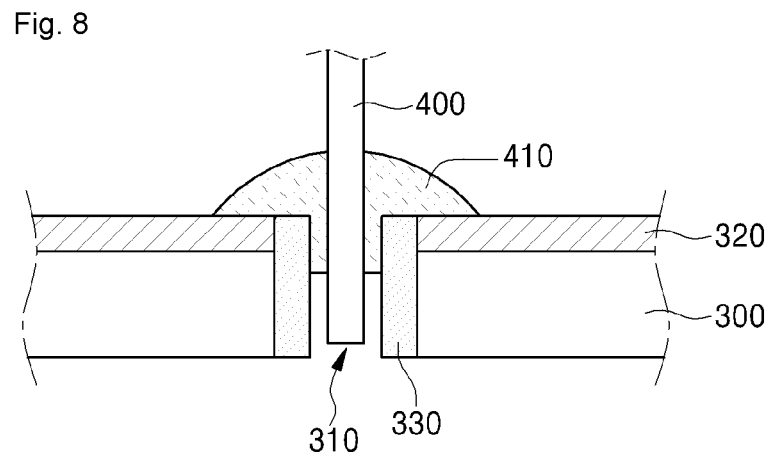

FIGS. 7 to 8 are views for explaining a method of manufacturing a battery apparatus in accordance with another exemplary embodiment. Here, a description of another exemplary embodiment, which is overlapped with that of an exemplary embodiment, will be omitted, and a feature that is not mentioned in the description of another exemplary embodiment is as same as that of an exemplary embodiment.

Referring to FIG. 7, a through-hole 310 is formed in a predetermined area of a board 300.

The board 300 may be a PCB on which a predetermined conductive pattern is formed. A plurality of through-holes 310 may be formed in the predetermined area of the board 300. The through-holes 310 may be formed in various methods. For example, the through-holes 310 may be formed by using a pressing machine at a plurality of positions to which a plurality of wires extending from the battery cells are inserted. Here, each of the through-holes 310 may be formed to have a diameter greater than that of the wire 400 extending from the battery cell. Also, a conductive pattern 320 may be formed on the board 300. Here, the conductive pattern 320 may be formed as a predetermined pattern on an area except for the through-hole 310. Also, the conductive pattern 320 may be spaced a predetermined distance from the through-hole 310. For example, the conductive pattern 320 may be spaced by about 0.3 mm from an outer circumference of the through-hole 310. Here, the spaced distance between the conductive pattern 320 and the through-hole 310 requires maintaining a distance by which the wire 400 does not contact the conductive pattern 400 when inserted into the through-hole 310. Also, the spaced distance between the conductive pattern 320 and the through-hole 310 requires maintaining a distance preventing a size of the soldering part 410 from increasing too much because the size of the soldering part 410 increases too much when the spaced distance therebetween is extremely large. Thus, the spaced distance between the conductive pattern 320 and the through-hole 310 may maintain a distance in a range from 0.3 mm to 1 mm in consideration of a size of the through-hole 310, a thickness of the wire 400, and a size of the soldering part 410.

Referring to FIG. 8, the soldering part 410 is formed by inserting the wire 400 inside the through-hole 310 and then soldering an upper side of the wire 400. Thus, the wire 400 and the conductive pattern 320 may be electrically connected to each other by the soldering part 410.

That is, the method of manufacturing the battery apparatus in accordance with another exemplary embodiment may include: a process of preparing at least one battery pack 100 including a plurality of battery cells 111 and 112; a process of forming a plurality of wires 400 connected with the plurality of battery cells 111 and 112; a process of preparing the board 300 on which at least one insulation layer and a conductive layer are laminated and a battery management system (BMS) is mounted; a process of forming the through-hole 310 in the board 300; a process of forming the conductive pattern 320 around the through-hole 310 on the board 300; a process of inserting the wire 400 inside the through-hole 310; and a process of forming the soldering part 410 connecting the wire 400 and the conductive pattern 320 by soldering the wire 400 above the board 300.

Here, another exemplary embodiment may be modified in various methods. For example, the conductive pattern 320 may be firstly formed in consideration of an area in which the through-hole 310 is to be formed, and then the through-hole 310 may be formed to be spaced apart from the conductive pattern 320. That is, a modified example of the method of manufacturing the battery apparatus in accordance with another exemplary embodiment may include: a process of forming the conductive pattern 320 on the board 300; a process of forming the through-hole 310 inside the through-hole 310; a process of inserting the wire 400 inside the through-hole 310; and a process of forming the soldering part 410 connecting the wire 400 and the conductive pattern 320 by soldering the wire 400 above the board 300.

As described above, in accordance with another exemplary embodiment, the conductive pattern 320 may be formed on the board 300 so as to be spaced apart from the through-hole 310, and the soldering part 410 may be formed by soldering the wire 400 above the board 300 after the wire 400 is inserted into the through-hole 310. Since the conductive pattern 320 is formed on the board 300 while being spaced apart from the through-hole 310, the wire 400 may not contact the conductive pattern 320 on the board 300 in the process of inserting the wire 400 into the through-hole 310, and the battery cells and the BMS 200 may not be electrically connected to each other before the soldering part 410 is formed.

In accordance with the exemplary embodiment, the wire may not be electrically connected with the conductive pattern on the board before the wire is inserted into the through-hole and soldered. That is, as the insulation layer is formed on the inside surface of the through-hole, the wire inserted to the through-hole may not be connected with the conductive pattern exposed to the inside of the through-hole or the conductive pattern on the board, and as the conductive pattern on the board is spaced a predetermined distance from the through-hole, the wire may not be connected with the conductive pattern on the board when inserted into the through-hole.

Thus, the exemplary embodiment may prevent the electrical damage of the BMS when the wire extending from the battery cell is soldered onto the board to connect the battery cell and the BMS. That is, even when the BMS is not connected sequentially from the battery cell of the low battery bank, the electrical damage may not be generated in the BMS.

As described above, the technical idea of the present invention has been specifically described with respect to the above embodiments, but it should be noted that the foregoing embodiments are provided only for illustration while not limiting the present invention. Various embodiments may be provided to allow those skilled in the art to understand the scope of the preset invention, but the present invention is not limited thereto.

What is claimed is:

1. A battery apparatus comprising:
   a battery pack comprising a plurality of battery cells;
   a battery management system (BMS) configured to manage the plurality of battery cells;
   a board to which the BMS is mounted;
   a plurality of wires extending from the plurality of battery cells onto the board;
   a plurality of through-holes formed in the board, the plurality of wires extending through the plurality of through-holes;
   a conductive pattern located on the board;
   a plurality of non-conductive areas, each of the plurality of non-conductive areas being formed on an area around a respective one of the plurality of through-holes; and
   a plurality of soldering parts, each of the plurality of soldering parts being formed on the respective one of the plurality of through-holes,
   wherein the plurality of soldering parts and the conductive pattern are located at a first side of the board, and the plurality of wires are configured to be inserted into the board from the first side of the board towards a second side of the board located opposite to the first side of the board.

2. The battery apparatus of claim 1, wherein the conductive pattern is connected with the BMS, and is connected with the plurality of wires by a respective one of the plurality of the soldering parts.

3. The battery apparatus of claim 1, wherein each of the plurality of non-conductive areas comprises a non-conductive layer formed on an inside surface of the respective one of the plurality of through-holes.

4. The battery apparatus of claim 3, wherein each non-conductive layer is made of a material different from that of an insulation layer of the board.

5. The battery apparatus of claim 1, wherein each non-conductive area comprises the conductive pattern spaced by a predetermined distance from an outer circumference of the respective one of the plurality of through-holes.

6. The battery apparatus of claim 5, wherein the conductive pattern is spaced by 0.3 millimeters (mm) to 1 mm from the outer circumference of the respective one of the plurality of through-holes.

7. A method of manufacturing a battery apparatus, the method comprising:

forming a through-hole in a board;

forming a conductive pattern on the board around the through-hole;

forming a non-conductive layer on an inside surface of the through-hole;

inserting a wire extending from a plurality of battery cells to an inside of the non-conductive layer of the through-hole; and forming a soldering part configured to connect the wire above the through-hole with the conductive pattern, wherein the soldering part and the conductive pattern are located at a first side of the board, and the wire is configured to be inserted into the board from the first side of the board towards a second side of the board located opposite to the first side of the board.

8. The method of claim 7, further comprising mounting a battery management system (BMS) on the board before inserting the wire after the non-conductive layer is formed.

9. The method of claim 7, wherein the conductive pattern is formed on the board from an outer circumference of the through-hole.

10. The method of claim 7, wherein the non-conductive layer is made of a material different from that of an insulation layer of the board.

11. A method of manufacturing a battery apparatus, the method comprising:

forming a plurality of through-holes in a board;

forming a conductive pattern on the board around the plurality of through-holes;

inserting each of a plurality of wires into a respective one of the plurality of through-holes from a respective one of a plurality of battery cells; and forming a plurality of soldering parts for the plurality of through-holes, each of the plurality of soldering parts connecting a respective one of the plurality of wires to the conductive pattern, wherein the conductive pattern is spaced by a predetermined distance from an outer circumference of the plurality of through-holes, and wherein the plurality of soldering parts and the conductive pattern are located at a first side of the board, and the plurality of wires are configured to be inserted into the board from the first side of the board towards a second side of the board located opposite to the first side of the board.

12. The method of claim 11, wherein the conductive pattern is formed on an area spaced by 0.3 millimeters (mm) to 1 mm from the outer circumference of the plurality of through-holes.

13. The battery apparatus of claim 1, wherein the conductive pattern covers an entire first surface of the board except for areas corresponding to the plurality of through-holes.

14. The battery apparatus of claim 1, wherein an end of one of the plurality of wires is located inside one of the plurality of through-holes in between the plurality of non-conductive areas.

\* \* \* \* \*